United States Patent [19]

Yamaguchi

[11] Patent Number: 5,604,827
[45] Date of Patent: Feb. 18, 1997

[54] METHOD FOR SELECTING A SEMICONDUCTOR INTEGRATED OPTICAL MODULATOR/LASER LIGHT SOURCE DEVICE

[75] Inventor: Masayuki Yamaguchi, Tokyo, Japan

[73] Assignee: NEC Corporation, Tokyo, Japan

[21] Appl. No.: 528,159

[22] Filed: Sep. 14, 1995

[30] Foreign Application Priority Data

Sep. 14, 1994 [JP] Japan .................................. 6-220077

[51] Int. Cl.⁶ ....................................................... G02F 1/01
[52] U.S. Cl. ................................................................. 385/1
[58] Field of Search ......................... 250/461.2; 381/1–9; 359/36, 15, 19, 29, 245, 311; 372/3, 6, 18, 20, 25, 93

[56] References Cited

U.S. PATENT DOCUMENTS

| | | | |
|---|---|---|---|
| 4,339,821 | 7/1982 | Coppock et al. | 372/18 |
| 4,635,263 | 1/1987 | Mollenauer | 372/6 |
| 5,005,946 | 4/1991 | Brandstetter | 359/15 |
| 5,032,002 | 7/1991 | Fonneland et al. | 359/36 |
| 5,325,324 | 6/1994 | Rentzepis et al. | 365/127 |
| 5,504,337 | 4/1996 | Lakowicz et al. | 250/461.2 |

OTHER PUBLICATIONS

H. Soda et al., "High–Power and High–Speed Semi–Insulating BH Structure Monolithic Electroabsorption Modulator/DFB Laser Light Source", Electronics Letters, Jan. 4, 1990, vol. 26, No. 1, pp. 9–10.

M. Aoki et al., "Low drive voltage and extremely low chirp integrated electroabsorption modulator/DFB laser for 2.5 Gbit/s 200km normal fibre transmission", Electronics Letters, Oct. 28, 1993, vol. 29, No. 22, pp. 1983–1984.

T. Kato et al., "Low penalty transmission characteristics of packaged DFB–LD/Modulatore Integrated Light Soucre with Selectively Grown Window–Facet Structure Fabricated by Bandgap Energy Controlled Selective MOVPE", Spring Conference of Institute of Electronics, Information and Communication Engineers of Japan, 1994, pp. 4–223.

Soda et al., *Electronics Letters*, vol. 26, No. 1; "High–Power and High–Speed Semi–Insulating BH Structure Monolithic Electroabsorption Molulator/DFB Laser Light Source" 4 Jan. 1990; p. 9, right column, paragraph 2, p. 10; Stevenage, Herts., GB.

Suzuki et al., *Journal of Lightwave Technology*, vol. 6, No. 6; "Electrical and Optical Interactions between Integrated InGaAsP/InP DFB Lasers and Electroabsorption Modulators"; 1 Jun. 1988; pp. 779–785, chapters IVa–IVc, FIGS. 2–6;New York, NY.

(List continued on next page.)

*Primary Examiner*—Akm E. Ullah
*Attorney, Agent, or Firm*—Young & Thompson

[57] ABSTRACT

The present invention provides a method for selecting a semiconductor integrated optical modulator/laser light source device comprising a modulator section and a laser section. The method comprises the following steps. The laser section is supplied with a direct current which is equal to or larger than a threshold current for allowing the laser section to show a laser emission when the modulator section is supplied with a pulse signal for allowing the modulator section to show a pulse modulation so as to allow a tight emitted directly from a facet of the laser section to show a transmission through a light wavelength dispersion medium within which the light on transmission shows a dispersion in wavelength. An intensity of the light having shown the dispersion in wavelength is measured to find a coefficient of variation in intensity of the light, wherein the variation is due to a wavelength chirping. There is verified the fact that the coefficient of variation in intensity of the light be below a predetermined reference level.

10 Claims, 7 Drawing Sheets

OTHER PUBLICATIONS

T. Katoaka et al., *Electronic Letters*, vol. 30, No. 11; "20Gbit/s Transmission Experiments Using and Integrated MQW Modulator/DFB Laser Module"; 26 May 1994; pp. 872–873.

Suzuki et al., *Journal of Lightwave Technology*, vol. Lt.–5, No. 9; "Monolithic Integration of InGaAsp/InP Distributed Feedback Laser and Electroabsorption Modulator by Vapor Epitaxy"; 9 Sep. 1987; pp. 1277–1285, Chapter IVa–IVc; New York, NY.

Yamaguchi et al., *Electronics Letters*, vol. 23, No. 5; "InGaAsP Carrier Injection Modulator Integrated with DFB LD"; 26 Feb. 1987; pp. 190, right column, last paragraph–192; Stevenage, GB.

Zucker et al., *Proceedings of the IEEE Lasers and ELectrooptics Society 1993 Annual Meeting*, paper SCL12.3; "Monolithically Integrated Laser/Mach–Zehnder Modulators Using Quatum Wells"; Nov. 15–18, 1993; pp. 641–642; San Jose, California.

METHOD FOR SELECTING A SEMICONDUCTOR INTEGRATED OPTICAL MODULATOR/LASER LIGHT SOURCE DEVICE

BACKGROUND OF THE INVENTION

The present invention relates to a method for selecting a semiconductor integrated optical modulator/laser light source device comprising a modulator section and a laser section.

There would be coming attractive a semiconductor optical modulator integrated laser light source device having an integration of a laser device such as a distributed fed back laser or a distributed reflection laser and a modulator such as art electroabsorption modulator on account of this light source device shows a small chirping when the modulator shows a modulation. The property of the small chirping of the laser device is suitable for a long-distance and large capacitance optical signal transmission. In the semiconductor optical modulator integrated laser light source device, the laser section is driven by a direct current and the modulator section is driven by pulse signals having binary levels wherein when one level is applied onto the modulator section, the modulator performs an attenuation function thereby the laser beam is absorbed in the modulator, resulting in almost no laser emission being obtained. By contrast, another level is applied onto the modulator section, the modulator shows no attenuation function thereby the laser beam pass through in the modulator without any attenuation, resulting in a laser emission being obtained.

This semiconductor optical modulator integrated laser light source device is, however, engaged with problems in generation of bit error due to the following reasons.

A first reason for generation of the bit error associated with the semiconductor optical modulator integrated laser light source device is concerned with a generation of wavelength chirping which is caused by optical and electrical interference between the laser section and the modulator section in the semiconductor optical modulator integrated laser light source device. The optical and electrical interference between the laser section and the modulator section may often be generated when an isolation resistance between the laser section and the modulator section is small or when the modulator section has a facet showing an insufficient reflective suppression function.

A second reason for generation of the bit error associated with the semiconductor optical modulator integrated laser light source device is concerned with a variation in optical power due to an influence of an electrical multiplication reflection which is caused by an impedance mismatching between the modulator and a modulator driver circuit for driving the modulator.

A third reason for generation of the bit error associated with the semiconductor optical modulator integrated laser light source device is concerned with an increase of the wavelength chirping of the modulator section due to rising an efficient of the phase modulation of the which is caused by a carrier accumulation. The carrier accumulated is generated by an optical absorption into the modulator section.

Therefore, it is required to verify whether the semiconductor optical modulator integrated laser light source device is available to be free from the above described problem with the bit error. In the prior art, the verifying process is accomplished by making a complicated measurement of a property of the transmission bit error rate associated with the semiconductor integrated optical modulator/laser light source device wherein the measurement of the transmission bit error rate property requires conducting an optical signal transmission test under the same conditions as the practical use and further confirming whether or not there exists a bit error for each of an extremely large numbers of bits as signals having transmitted in the test. Thus, it has been required to develop a quite novel method for selection thereof free from the above problem.

SUMMARY OF THE INVENTION

Accordingly, it is an object of the present invention to provide a novel convenient method for selecting a semiconductor integrated optical modulator/laser light source device comprising a modulator section and a laser section free from any problems as described above.

The above and other objects, features and advantages of the present invention will be apparent from the following descriptions.

The present invention provides a method for selecting a semiconductor integrated optical modulator/laser light source device comprising a modulator section and a laser section. The method comprises the following steps. The laser section is supplied with a direct current which is equal to or larger than a threshold current for allowing the laser section to show a laser emission when the modulator section is supplied with a pulse signal for allowing the modulator section to show a pulse modulation so as to allow a light emitted directly from a facet of the laser section to show a transmission through a light wavelength dispersion medium within which the light on transmission shows a dispersion in wavelength. An intensity of-the light having shown the dispersion in wavelength is measured to find a coefficient of variation in intensity of the light, wherein the variation is due to a wavelength chirping. There is verified the fact that the coefficient of variation in intensity of the light be below a predetermined reference level.

The present invention also provides a method for selecting a semiconductor integrated optical modulator/laser light source device comprising a modulator section and a laser section. The method comprises the following steps. The laser section is supplied with a direct current which is equal to or larger than a threshold current for allowing the laser section to show a laser emission when the modulator section is supplied with a binary pulse signal both with first and second voltage levels and with a frequency which is within a practically available range for allowing the modulator section to show a pulse modulation where the modulator section performs no light attenuation function in the first voltage level of the binary pulse signal and the modulator section performs a light attenuation in the second voltage level. Any of first and second lights emitted from facets of the laser section and the modulator section respectively is caused to show spectra with first and second peaks in intensity versus frequency, provided that the first peak appears only in the first voltage level of the binary pulse signal and the second peak appears only in the second voltage level of the binary pulse signal. There is verified the fact that a difference in frequency between the first and second peaks be below a predetermined reference value.

The present invention also provides a method for selecting a semiconductor integrated optical modulator/laser light source device comprising a modulator section and a laser section. The method comprises the following steps. The laser section is supplied with a direct current which is equal to or larger than a threshold current for allowing the laser section to show a laser emission when the modulator section is reversely biased with first and second direct-current voltages respectively corresponding to first and second voltage levels of a binary pulse signal to be practically used for a pulse modulation of the modulator section wherein the modulator section performs no light attenuation function in the first direct-current voltage and the modulator section performs a light attenuation in the second direct-current voltage. A light emitted from a facet of the laser section is caused to show spectra with first and second peaks in intensity versus frequency, provided that the first peak appears only in the first direct-current voltage and the second peak appears only in the second direct-current voltage. There is verified the fact that a difference in frequency between the first and second peaks be below a predetermined reference value.

The present invention also provides a method for selecting a semiconductor integrated optical modulator/laser light source device comprising a modulator section and a laser section. The method comprises the following steps. There are measured both a first threshold current of the laser section when the modulator section is reversely biased with a first direct-current voltage and a second threshold current of the laser section when the modulator section is reversely biased with a second direct-current voltage. The first and second direct-current voltages respectively correspond to first and second voltage levels of a binary pulse signal to be practically used for a pulse modulation of the modulator section wherein the modulator section performs no light attenuation function in the first direct-current voltage and the modulator section performs a light attenuation in the second direct-current voltage. There is verified the fact that a difference between the first and second threshold currents be below a predetermined reference value.

The present invention also provides a method for selecting a semiconductor integrated optical modulator/laser light source device comprising a modulator section and a laser section. The method comprises the following steps. There are measured both a first power of a light emitted from a facet of the laser section supplied with a direct current which is equal to or larger than a threshold current when the modulator section is reversely biased with a first direct-current voltage and a second power of the light emitted from the facet of the laser section supplied with a direct current which is equal to or larger than a threshold current when the modulator section is reversely biased with a second direct-current voltage, wherein the first and second direct-current voltages respectively correspond to first and second voltage levels of a binary pulse signal to be practically used for a pulse modulation of the modulator section and further the modulator section performs no light attenuation function in the first direct-current voltage and the modulator section performs a light attenuation in the second direct-current voltage. There is verified the fact that a difference between the first and second powers of the light be below a predetermined reference value.

The present invention also provides a method for selecting a semiconductor integrated optical modulator/laser light source device comprising a modulator section and a laser section. The method comprises the following steps. There are measured both a first power of a light emitted from a facet of the modulator section when a terminal of the modulator section has a ground potential and a second power of the light emitted from the facet of the modulator section when the terminal of the modulator section is electrically floated so that the modulator section is forwardly biased with a built-in-potential generated at a p-n junction in the modulator. There is verified the fact that a difference between the first and second powers of the light be below a predetermined reference value.

The present invention also provides a method for selecting a semiconductor integrated optical modulator/laser light source device comprising a modulator section and a laser section. The method comprises the following steps. The laser section is supplied with a direct current which is equal to or larger than a threshold current for allowing the laser section to show a laser emission so as to allow a light emitted from the laser section to pass through the modulation section within which the light shows an absorption thereby electron-hole pairs which may act as carriers are generated wherein a terminal of the modulator section is grounded to cause a photo current due to the electron-hole pairs generated. There is verified the fact that the photo current caused be below a predetermined reference value.

BRIEF DESCRIPTIONS OF THE DRAWINGS

Preferred embodiments of the present invention will be described in detail with reference to the accompanying drawings.

DESCRIPTIONS OF THE INVENTION

The first present invention is to provides a method for selecting a semiconductor integrated optical modulator/laser light source device comprising a modulator section and a laser section. The selection method is completely free from any undesirable requirement for making a complicated measurement of a property of the transmission bit error rate associated with the semiconductor integrated optical modulator/laser light source device wherein the measurement of the transmission bit error rate property requires conducting an optical signal transmission test under the same conditions as the practical use and further confirming whether or not there exists a bit error for each of an extremely large numbers of bits as signals having transmitted in the test. This method is to verify whether the laser device is free from a wavelength chirping which is caused by optical and electrical interference between the modulator section and the laser section when an isolation resistance between the modulation section and the laser section.

The method comprises the following steps. The laser section is supplied with a direct current which is equal to or larger than a threshold current for allowing the laser section to show a laser emission. The modulator section is supplied with a pulse signal for allowing the modulator section to show a pulse modulation. As a result, if an isolation resistance between the modulator section and the laser section is insufficient, the laser section receives an influence of the wavelength chirping caused from the modulator section. A light emitted directly from a facet of the laser section shows a transmission through a light wavelength dispersion medium within which the light on transmission shows a dispersion in wavelength. If the wavelength chirping of the light is generated in the laser section, the light wavelength dispersion medium causes the variation in intensity of the light having transmitted via the light wavelength dispersion medium. An intensity of the light having shown the dispersion in wavelength is measured to find a coefficient of variation in intensity of the light, wherein the variation is due to the wavelength chirping. There is verified the fact that the coefficient of variation in intensity of the light be below a predetermined reference level. If the coefficient of variation in intensity of the light be below a predetermined reference level, this means that the isolation resistance between the laser section and the modulator section is sufficiently large thereby it may be evaluated that the integrated modulator/laser light source device is available. If, however, the coefficient of variation in intensity of the light be above the predetermined reference level, this means that the isolation resistance between the laser section and the modulator section is not sufficiently large thereby it may be evaluated that the integrated modulator/laser light source device is unavailable.

The predetermined reference level may be set according to a relationship of the coefficient of variation in intensity of light to a power penalty in view of a transmission bit rate as well as a light wavelength dispersion property and a length of the light wavelength dispersion medium, wherein the length is in a direction of the transmission of the light of the light wavelength dispersion medium. The predetermined reference level may be set to allow the power penalty to be equal to or below 1 dB. When the wavelength chirping is large, this results in a large coefficient of variation in intensity of the light is also large. If the coefficient of variation in intensity of the light is large, the power penalty is also large. The power penalty has a positive interrelationship to the coefficient of variation in intensity of the light. If the bit rate is large, the reference value is required to be set at a smaller value.

The light wavelength dispersion medium may comprise an optical fiber. The optical fiber may have the same length as needed for a practical use. In this case, the predetermined reference level is set according to a relationship of the coefficient of variation in intensity of light to the power penalty in view of a transmission bit rate set as required as well as a light wavelength dispersion property of the optical fiber. In place of use of the optical fiber, the light wavelength dispersion medium may comprise a prism having almost the same light wavelength dispersion property as that of an optical fiber to be practically used.

It is preferable that the pulse signal supplied to the optical modulator section comprises a rectangular-shaped pulse wave form. In this case, the pulse signal may preferably have the same rise and decay times, the same amplitude and the same width as those of a pulse signal to be practically used. The pulse signal may preferably have the same rise and decay times, the same amplitude and a different width from those of a pulse signal to be practically used.

The optical modulator section may comprise either an electroabsorption modulator or a semiconductor Mach-Zehnder optical modulator. The laser section may comprise a distributed feedback laser. The intensity of the light may be measured by use of a photodetector which is commercially available.

The second present invention provides a method for selecting a semiconductor integrated optical modulator/laser light source device comprising a modulator section and a laser section. The selection method is completely free from any undesirable requirement for making a complicated measurement of a property of the transmission bit error rate associated with the semiconductor integrated optical modulator/laser light source device wherein the measurement of the transmission bit error rate property requires conducting an poetical signal transmission test under the same conditions as the practical use and further confirming whether or not there exists a bit error for each of an extremely large numbers of bits as signals having transmitted in the test. This method is to verify whether the laser device is free from a wavelength chirping which is caused by optical and electrical interference between the modulator section and the laser section when an isolation resistance between the modulation section and the laser section.

The method comprises the following steps. The laser section is supplied with a direct current which is equal to or larger than a threshold current for allowing the laser section to show a laser emission when the modulator section is supplied with a binary pulse signal both with first and second voltage levels corresponding to mark and space levels and with a frequency which is within a practically available range for allowing the modulator section to show a pulse modulation where the modulator section performs no light attenuation function in the first voltage level or the mark level of the binary pulse signal and the modulator section performs a light attenuation in the second voltage level or the space level. If the mark level is applied onto the modulator section, a slight laser emission from a facet of the modulator section is generated. If the space level is applied onto the modulator section, a laser emission from a facet of the modulator section is generated. Any of first and second lights emitted from facets of the laser section and the modulator section respectively is caused to show spectra with first and second peaks in intensity versus frequency, provided that the first peak appears only in the first voltage level or the mark level of the binary pulse signal and the second peak appears only in the second voltage level or the space level of the binary pulse signal. The light emitted from the facet of the laser section is free from the attenuation by the modulator section both when the mark level is applied onto the modulator section and when the space level is applied onto the modulator section. By contrast, the light emitted from the facet of the modulator section receives the attenuation only when the space level is applied onto the modulator section thereby the intensity of this light is considerably reduced. On the other hand, there is generated a difference in wavelength of both the first and second lights emitted from the facets of the laser section and the modulator section respectively. The difference in the wavelength of the first lights between when the mark level is applied onto the modulator section and when the space level is applied onto the modulator section is the same as that of the second signal. For that reason, there is available to measure the difference in the wavelength of either the first or second light. The generated difference in the wavelength of the light results in a generation of the difference in frequency of the light. There is verified the fact that a difference in frequency between the first and second peaks be below a predetermined reference value.

The predetermined reference value may be set according to a relationship of the difference in frequency between the first and second peaks to a power penalty in view of a transmission bit rate as well as a practical transmission distance. In this case, the predetermined reference value may be set to allow the power penalty to be equal to or below 1 dB. The spectra may be caused by use of a spectroscope which is commercially available. The practically available range of frequency of the binary pulse signal may be set to correspond to a range in bit rate from 200 kb/s to 200 Mb/s. The binary pulse signal has the same amplitude as that of a pulse signal to be practically used. In this case, the binary pulse signal supplied to the optical modulator section may comprise a rectangular-shaped pulse wave form.

The optical modulator section may comprise either an electroabsorption modulator or a semiconductor Mach-Zehnder optical modulator. The laser section may comprise a distributed feedback laser.

The third present invention provides a method for selecting a semiconductor integrated optical modulator/laser light source device comprising a modulator section and a laser section. The selection method is completely free from any undesirable requirement for making a complicated measurement of a property of the transmission bit error rate associated with the semiconductor integrated optical modulator/laser light source device wherein the measurement of the transmission bit error rate property requires conducting an optical signal transmission test under the same conditions as the practical use and further confirming whether or not there exists a bit error for each of an extremely large numbers of bits as signals having transmitted in the test. This method is to verify whether the laser device is free from a wavelength chirping which is caused by optical and electrical interference between the modulator section and the laser section when an isolation resistance between the modulation section and the laser section.

The method comprises the following steps. The laser section is supplied with a direct current which is equal to or larger than a threshold current for allowing the laser section to show a laser emission. The modulator section is reversely biased with first and second direct-current voltages respectively corresponding to first and second voltage levels of a binary pulse signal to be practically used for a pulse modulation of the modulator section wherein the modulator section performs no light attenuation function in the first direct-current voltage and the modulator section performs a light attenuation in the second direct-current voltage. A light emitted from a facet of the laser section is caused to show spectra with first and second peaks in intensity versus frequency, provided that the first peak appears only in the first direct-current voltage and the second peak appears only in the second direct-current voltage. There is verified the fact that a difference in frequency between the first and second peaks be below a predetermined reference value.

It may optionally be available to add, prior to the verifying step, a further step of compensating for an increment of the difference in frequency between the first and second peaks, wherein the increment is due to an emission light wavelength shift of the laser section and the shift is caused by a heat generation in the modulator section only when reversely biased with the second direct current voltage.

The predetermined reference value may advantageously be set according to a relationship of the difference in frequency between the first and second peaks to a power penalty in view of a transmission bit rate as well as a practical transmission distance. The predetermined reference value may preferable be set to allow the power penalty to be equal to or below 1 dB.

The predetermined reference value may also be set according to a relationship of the difference in frequency between the first and second peaks to a power penalty in view of a transmission bit rate and a practical transmission distance as well as an increment of the difference in frequency between the first and second peaks, the increment being due to an emission light wavelength shift of the laser section, the shift being caused by a heat generation in the modulator section only when reversely biased with the second direct current voltage.

The spectra may advantageously be caused by use of a spectroscope which is commercially available.

The first and second direct-current voltages supplied to the modulator section may practically be set at 0 V and −3 V respectively.

The optical modulator section may optionally comprise either an electroabsorption modulator or a semiconductor Mach-Zehnder optical modulator. The laser section may comprise a distributed feedback laser.

The fourth present invention provides a method for selecting a semiconductor integrated optical modulator/laser light source device comprising a modulator section and a laser section. The selection method is completely free from any undesirable requirement for making a complicated measurement of a property of the transmission bit error rate associated with the semiconductor integrated optical modulator/laser light source device wherein the measurement of the transmission bit error rate property requires conducting an optical signal transmission test under the same conditions as the practical use and further confirming whether or not there exists a bit error for each of an extremely large numbers of bits as signals having transmitted the test. This method is to verify whether the laser device is free from a wavelength chirping which is caused by optical and electrical interference between the modulator section and the laser section when an isolation resistance between the modulation section and the laser section.

The method comprises the following steps. There are measured both a first threshold current of the laser section when the modulator section is reversely biased with a first direct-current voltage and a second threshold current of the laser section when the modulator section is reversely biased with a second direct-current voltage. The first and second direct-current voltages respectively correspond to first and second voltage levels of a binary pulse signal to be practically used for a pulse modulation of the modulator section wherein the modulator section performs no light attenuation function in the first direct-current voltage and the modulator section performs a light attenuation in the second direct-current voltage. There is verified the fact that a difference between the first and second threshold currents be below a predetermined reference value.

The first and second threshold currents are measured by verifying an emission of the light from the facet of the laser section by use of a photodetector.

It may be available to further add the step of compensating, prior to the verifying step, for an increment of the difference between the first and second threshold currents wherein the increment is due to an emission light wavelength shift of the laser section and the shift is caused by a heat generation in the modulator section only when reversely biased with the second direct current voltage.

The predetermined reference value may be set according to a relationship of the difference between the first and second threshold currents to a power penalty in view of a transmission bit rate as well as a practical transmission distance. The predetermined reference value is set to allow the power penalty to be equal to or below 1 dB.

The predetermined reference value may be set according to a relationship of the difference in frequency between the first and second peaks to a power penalty in view of a transmission bit rate and a practical transmission distance as well as an increment of the difference between the first and second threshold currents, the increment being due to an emission light wavelength shift of the laser section, wherein the shift is caused by a heat generation in the modulator section only when reversely biased with the second direct current voltage. The first and second direct-current voltages supplied to the modulator section may practically be set at 0 V and −3 V respectively.

The optical modulator section may comprise either an electroabsorption modulator which may commercially be available or a semiconductor Mach-Zehnder optical modulator. The laser section may comprise a distributed feedback laser.

The fifth present invention provides a method for selecting a semiconductor integrated optical modulator/laser light source device comprising a modulator section and a laser section. The selection method is completely free from any undesirable requirement for making a complicated measurement of a property of the transmission bit error rate associated with the semiconductor integrated optical, modulator/ laser light source device wherein the measurement of the transmission bit error rate property requires conducting an optical signal transmission test under the same conditions as the practical use and further confirming whether or not there exists a bit error for each of an extremely large numbers of bits as signals having transmitted in the test. This method is to verify whether the laser device is free from a wavelength chirping which is caused by optical and electrical interference between the modulator section and the laser section when an isolation resistance between the modulation section and the laser section.

The method comprises the following steps. There are measured both a first power of a light emitted from a facet of the laser section supplied with a direct current which is equal to or larger than a threshold current when the modulator section is reversely biased with a first direct-current voltage and a second power of the light emitted from the facet of the laser section supplied with a direct current which is equal to or larger than a threshold current when the modulator section is reversely biased with a second direct-current voltage, wherein the first and second direct-current voltages respectively correspond to first and second voltage levels of a binary pulse signal to be practically used for a pulse modulation of the modulator section and further the modulator section performs no light attenuation function in the first direct-current voltage and the modulator section performs a light attenuation in the second direct-current voltage. There is verified the fact that a difference between the first and second powers of the light be below a predetermined reference value.

The first and second powers of the light may be measured by use of a photodetector which may commercially be available.

It may be available to add a further step of compensating, prior to the verifying step, for an increment of the difference between the first and second powers of the light, the increment being due to an emission light wavelength shift of the laser section, wherein the shift is caused by a heat generation in the modulator section only when reversely biased with the second direct current voltage.

The predetermined reference value may be set according to a relationship of the difference between the first and second powers of the light to a power penalty in view of a transmission bit rate as well as a practical transmission distance. In this case, the predetermined reference value may practically be set to allow the power penalty to be equal to or below 1 dB.

The predetermined reference value may also be set according to a relationship of the difference between the first and second powers of the light to a power penalty in view of a transmission bit rate and a practical transmission distance as well as a practical difference between the first and second powers of the light, wherein the increment is due to an emission light wavelength shift of the laser section and the shift is caused by a heat generation in the modulator section only when reversely biased with the second direct current voltage.

The first and second direct-current voltages supplied to the modulator section may practically be set at 0 V and −3 V respectively.

The optical modulator section may comprise either an electroabsorption modulator or a semiconductor Mach-Zehnder optical modulator. The laser section may comprise a distributed feedback laser.

The sixth present invention provides a method for selecting a semiconductor integrated optical modulator/laser light source device comprising a modulator section and a laser section. The selection method is completely free from any undesirable requirement :for making a complicated measurement of a property of the transmission bit error rate associated with the semiconductor integrated optical modulator/laser light source device wherein the measurement of the transmission bit error rate property requires conducting an optical signal transmission test under the same conditions as the practical use and further confirming whether or not there exists a bit error for each of an extremely large numbers of bits as signals having transmitted in the test. The method is to verify whether the laser section is free from a variation in output of a light emitted from the laser section wherein the output variation is due to an electrical multiplication reflection caused by an impedance mismatching between the modulator section and a modulator driver circuit could to the modulator for driving the modulator.

The method comprises the following steps. There are measured both a first power of a light emitted from a facet of the modulator section when a terminal of the modulator section has a ground potential and a second power of the light emitted from the facet of the modulator section when the terminal of the modulator section is electrically floated so that the modulator section is forwardly biased with a built-in-potential generated at a p-n junction in the modulator. There is verified the fact that a difference between the first and second powers of the light be below a predetermined reference value.

The first and second powers of the light may be measured by use of a photodetector which may commercially be available. The predetermined reference value may be set according to a relationship of the difference between the first and second powers of the light to a power penalty in view of a transmission bit rate as well as a practical transmission distance. In this case, the predetermined reference value may practically be set to allow the power penalty to be equal to or below 1 dB. In place of floating the terminal of the modulator section, the terminal is applied with such a positive voltage that the p-n junction of the modulator section is forwardly biased with a voltage substantially corresponding to the built-in-potential. The positive voltage is about +0.6 V.

The optical modulator section may comprise either an electroabsorption modulator or a semiconductor Mach-Zehnder optical modulator. The laser section may comprise a distributed feedback laser.

The seventh present invention provides a method for selecting a semiconductor integrated optical modulator/laser light source device comprising a modulator section and a laser section. The selection method is completely free from any undesirable requirement for making a complicated measurement of a property of the transmission bit error rate associated with the semiconductor integrated optical modulator/laser light source device wherein the measurement of the transmission bit error rate property requires conducting an optical signal transmission test under the same conditions as the practical use and further confirming whether or not there exists a bit error for each of an extremely large numbers of bits as signals having transmitted in the test. The method is to verify whether the modulator section is free from a wavelength chirping due to an increased coefficient of a phase modulation of the modulator wherein the increase in the phase modulation coefficient is due to a carrier accumulation in the modulator section by the optical absorption into the modulator section.

The method comprises the following steps. The laser section is supplied with a direct current which is equal to or larger than a threshold current for allowing the laser section to show a laser emission so as to allow a light emitted from the laser section to pass through the modulation section within which the light shows an absorption thereby electron-hole pairs which may act as carriers are generated wherein a terminal of the modulator section is grounded to cause a photo current due to the electron-hole pairs generated. There is verified the fact that the photo current caused be below a predetermined reference value.

The photo current is measured by use of an ampere meter which may be commercially available.

The predetermined reference value may be set according to a relationship of the photo current to a power penalty in view of a bit error rate as well as a practical transmission distance. The predetermined reference value may practically be set to allow the power penalty to be equal to or below 1 dB. The predetermined reference value may optionally be set in further view of a load resistance which is needed to allow the modulator to show a high speed modulation.

The optical modulator section may comprise either an electroabsorption modulator or a semiconductor Mach-Zehnder optical modulator. The laser section may comprise a distributed feedback laser.

PREFERRED EMBODIMENTS

Figure 1:
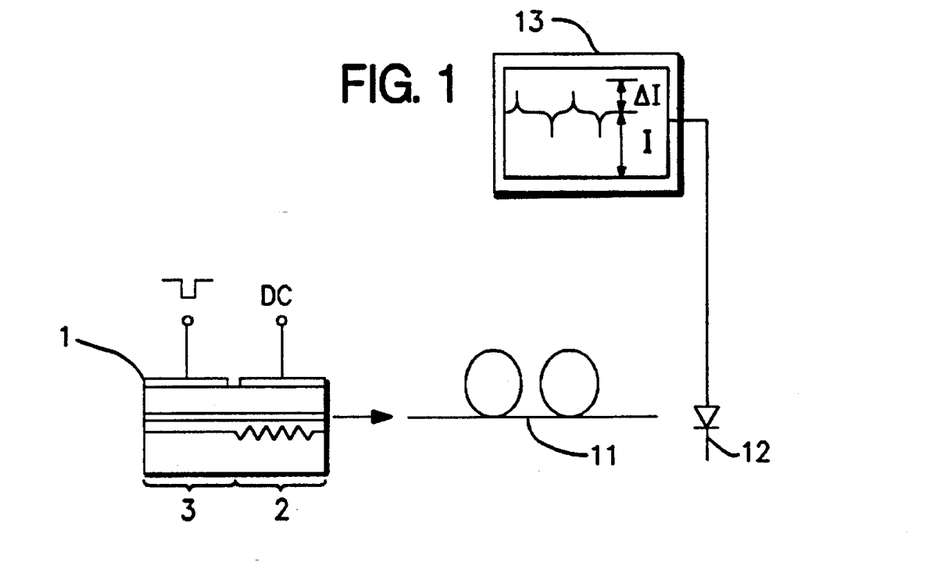
FIG. 1 is a view illustrative of a novel method for selecting a semiconductor integrated optical modulator/laser light source device comprising a modulator section and a laser section in a first embodiment according to the present invention.
Figure 2:
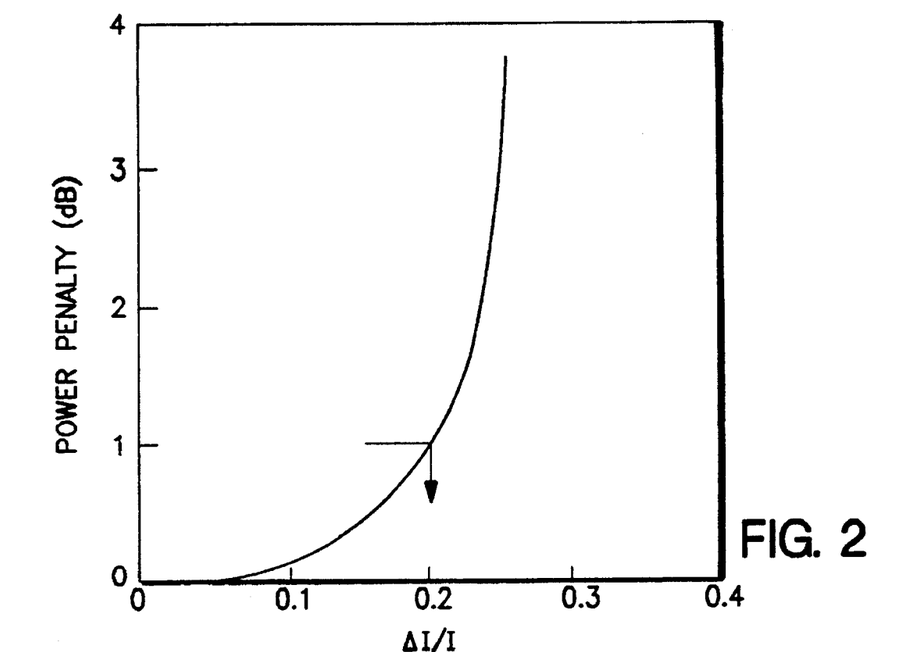
FIG. 2 is a diagram illustrative of a variation in power penalty of a light having shown a transmission via an optical fiber versus a coefficient of variation in intensity of the light in a first embodiment according to the present invention.

A first embodiment according to the first present invention will be described with reference to FIGS. 1 and 2 in which a method for selecting the semiconductor optical modulator/laser light source device comprising a laser section 2 and a modulator section 3 is provided. The laser section 2 is supplied with a direct current DC which is equal to or larger than a threshold current for allowing the laser section to show a laser emission. The modulator section 3 is supplied with a rectangular-shaped pulse signal for allowing the modulator section to show a pulse modulation. The pulse signal is the same as that practically used. As a result, if an isolation resistance between the modulator section 3 and the laser section 2 is insufficient, the laser section 2 receives an influence of the wavelength chirping caused from influences of the interference to the modulator section 3. A light emitted directly from a facet of the laser section is fetched by a photo-detector such as a photo-diode 12 via a an optical fiber 11. The photo-detector then convert the optical signal into an electrical signal which is received by an oscilloscope 13 to display the intensity of the electrical signal to evaluate the intensity of the optical signal having shown the transmission via the optical fiber 11. The optical fiber 11 has the same length as that of the optical fiber practically used. The variation in the intensity of the light is generated by the wavelength chirping which is caused by the rise and decay of the rectangular-shaped pulse signal applied onto the modulator section. FIG. 2 illustrates the power penalty (dB) versus the coefficient of variation in intensity of the light under the condition of a bit rate of 2.5 Gb/s, from which it could be understood that when the power penalty is required to be below 1 dB, the coefficient of variation in intensity of the light is required to be below 0.2. Then, the reference value is set at 0.2. There is verified the fact that the coefficient of variation in intensity of the light be below a predetermined reference level of 0.2. If the coefficient of variation in intensity of the light be below a predetermined reference level, this means that the isolation resistance between the laser section and the modulator section is sufficiently large thereby it may be evaluated that the integrated modulator/laser light source device is available. If, however, the coefficient of variation in intensity of the light be above the predetermined reference level, this means that the isolation resistance between the laser section and the modulator section is not sufficiently large thereby it may be evaluated that the integrated modulator/laser light source device is unavailable.

Figure 3:
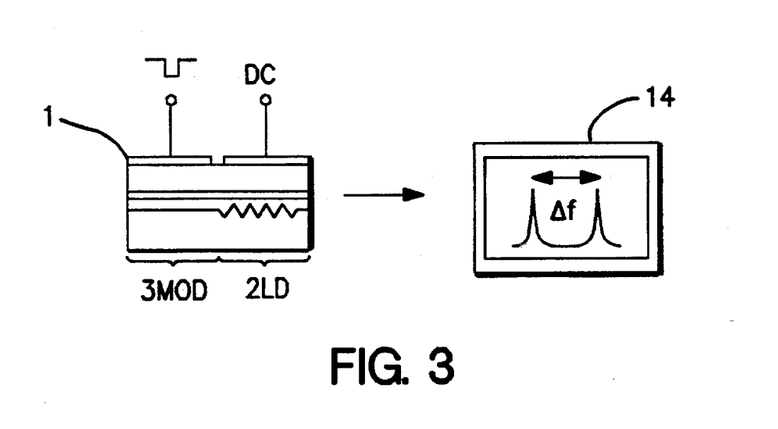
FIGS. 3 is a view illustrative of a novel method for selecting a semiconductor integrated optical modulator/laser light source device comprising a modulator section and a laser section in a second embodiment according to the present invention.
Figure 4:
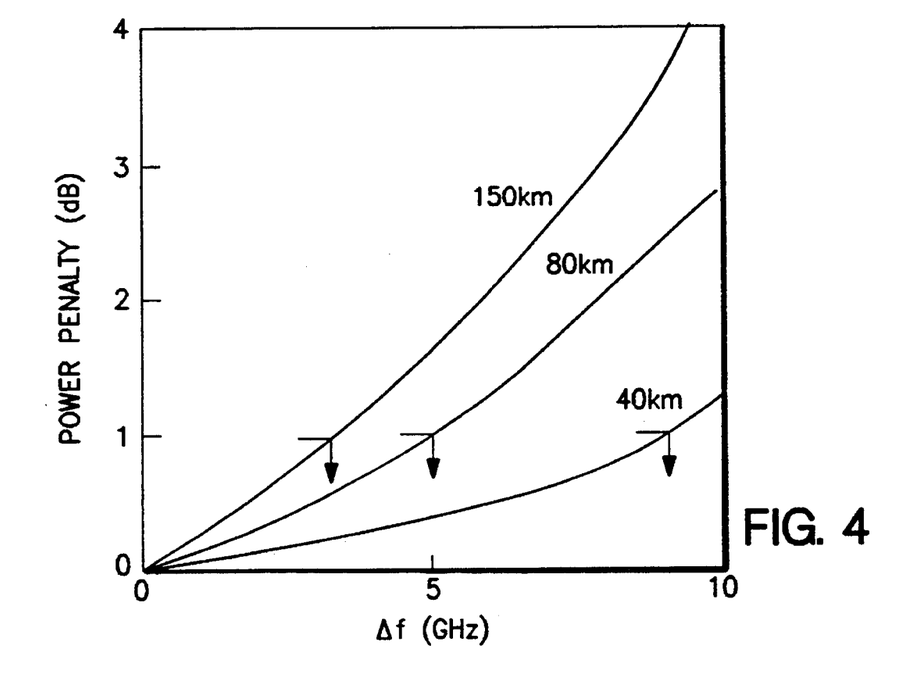
FIG. 4 is a diagram illustrative of a variation in power penalty of a light having been emitted from a facet of a laser section versus a variation in frequency of the light in a second embodiment according to the present invention.

A second embodiment according to the first present invention will be described with reference to FIGS. 3 and 4 in which a method for selecting the semiconductor optical modulator/laser light source device comprising a laser section 2 and a modulator section 3 is provided. The laser section 2 is supplied with a direct current DC which is equal to or larger than a threshold current for allowing the laser section 2 to show a laser emission when the modulator section is supplied with a binary pulse signal both with first and second voltage levels corresponding to mark and space levels and with a frequency which is within a practically available range for allowing the modulator section to show a pulse modulation. In the pulse modulation, the modulator section 3 performs no light attenuation function in the first voltage level or the mark level of the binary pulse signal and the modulator section performs a light attenuation in the second voltage level or the space level. If the mark level is applied onto the modulator section, a slight laser emission from a facet of the modulator section is generated. If the space level is applied onto the modulator section, a laser emission from a facet of the modulator section is generated. The first light emitted from the facet of the laser section 2 free from the attenuation by the modulator section 3 shows spectra with first and second peaks in intensity versus frequency, provided that the first peak appears only in the first voltage level or the mark level of the binary pulse signal and the second peak appears only in the second voltage level or the space level of the binary pulse signal. There is verified the fact that a difference in frequency between the first and second peaks be below a predetermined reference value.

The predetermined reference value may be set according to a relationship of the difference in frequency between the first and second peaks to a power penalty in view of a transmission bit rate as well as a practical transmission distance. FIG. 4 illustrates the power penalty versus the difference in frequency between the first and second peaks under the condition of the bit rate set at 2.5 Gb/s and different three distance transmissions of 150 km, 80 km and 40 km. When considering the 80 km transmission, the power penalty below 1 dB requires the difference in frequency of the light at the first and second intensity peaks to be below 5 GHz. The practically available range of frequency of the binary pulse signal may be set to correspond to a range in bit rate from 200 kb/s to 200 Mb/s. The binary pulse signal has the same amplitude as that of a pulse signal to be practically used. In this case, the binary pulse signal supplied to the optical modulator section may comprise a rectangular-shaped pulse wave form.

Figure 5:
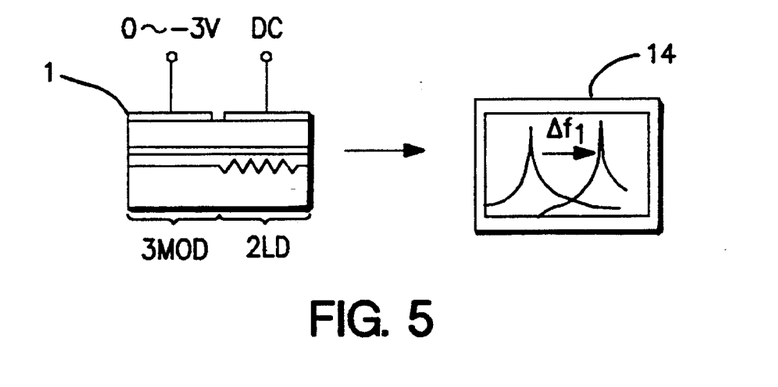
FIG. 5 is a view illustrative of a novel method for selecting a semiconductor integrated optical modulator/laser light source device comprising a modulator section and a laser section in a third embodiment according to the present invention.
Figure 6:
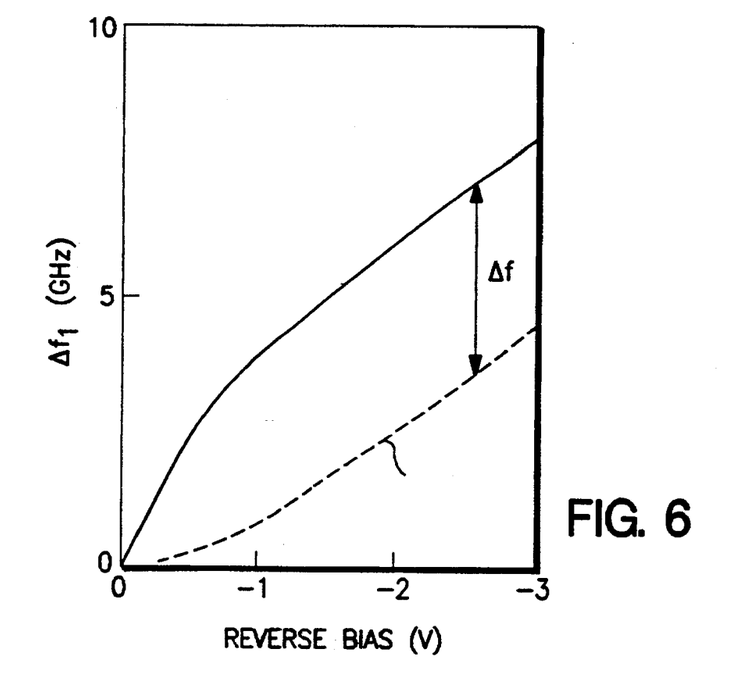
FIG. 6 is a diagram illustrative of a variation in frequency of a light having been emitted from a facet of a laser section versus a reverse bias voltage applied onto a modulator section in a third embodiment according to the present invention.

A third embodiment according to the present invention will be described with reference to FIGS. 5 and 6 in which a novel method for selecting a semiconductor integrated optical modulator/laser light source device comprising a laser section 2 and a modulator section 3 is provided. The laser section 2 is supplied with a direct current which is equal to or larger than a threshold current for allowing the laser section to show a laser emission. The modulator section is reversely biased with −3 V or not biased with 0 V. The modulator section 3 performs no light attenuation function when 0 V is applied onto the modulator section and does perform a light attenuation when −3 V is applied onto the modulator section 3. A light emitted from a facet of the laser section 2 is caused to show spectra with first and second peaks in intensity versus frequency, provided that the first peak appears when applying 0 V and the second peak appears when applying −3 V. There is verified the fact that a difference in frequency between the first and second peaks be below a predetermined reference value. In the verifying step, there is needed compensating for an increment of the difference in frequency between the first and second peaks, wherein the increment is due to an emission light wavelength shift of the laser section and the shift is caused by a heat generation in the modulator section only when reversely biased with −3 V.

The predetermined reference value may be set according to a relationship of the difference in frequency between the first and second peaks to a power penalty in view not only of a transmission bit rate as well as a practical transmission distance but also the increment of the frequency difference due to the heat generation. FIG. 6 illustrates the difference in frequency of the first and second peaks versus the reverse bias voltage and the increment of the frequency difference due to the heat generation caused by the reverse bias. FIG. 6 is used when making the compensation for the increment of the frequency difference due to the heat generation. There is verified whether the compensated frequency difference be below the predetermined reference value which is determined by use of the relationship of the power penalty to the frequency difference between the first and second peaks under the condition of the bit rate set at 2.5 Gb/s and different three distance transmissions of 150 km, 80 km and 40 km illustrated in FIG. 4. When considering the 80 km transmission, the power penalty below 1 dB requires the compensated difference in frequency of the light at the first and second intensity peaks to be below 5 GHz.

Figure 7:
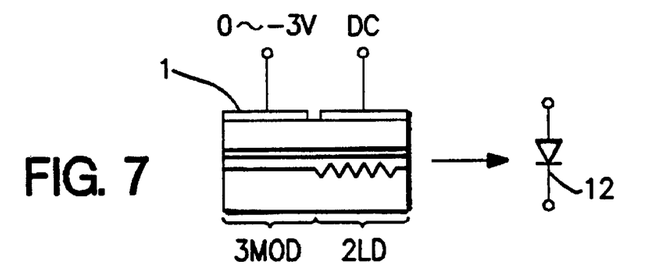
FIG. 7 is a view illustrative of a novel method for selecting a semiconductor integrated optical modulator/laser light source device comprising a modulator section and a laser section in a fourth embodiment according to the present invention.
Figure 8:
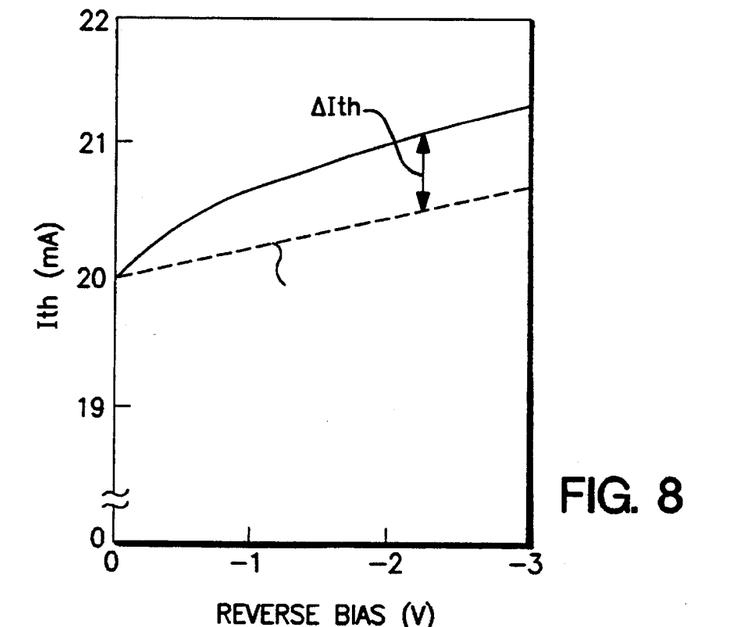
FIG. 8 is a diagram illustrative of a variation in threshold current of a laser section versus a reverse bias voltage applied onto a modulator section in a fourth; embodiment according to the present invention.

A fourth embodiment according to the present invention will be described with reference to FIGS. 7 and 8 in which a novel method for selecting a semiconductor integrated optical modulator/laser light source device comprising a laser section 2 and a modulator section 3 is provided. There are measured both a first threshold current of the laser section 2 when the modulator section is reversely biased with 0 V and a second threshold current of the laser section when the modulator section is reversely biased with −3 V. The modulator section performs no light attenuation function when applying 0 V onto the modulator section 3 and the modulator section 3 performs a light attenuation when applying −3 V onto the modulator section 3. There is verified the fact that a difference between the first and second threshold currents be below a predetermined reference value by confirming a laser emission from the laser section 2 by use of a photo-diode 12.

In the verifying step, there is made a compensation for an increment of the difference between the first and second threshold currents wherein the increment is due to an emission light wavelength shift of the laser section and the shift is caused by a heat generation in the modulator section only when reversely biased with the second direct current voltage.

Figure 9:
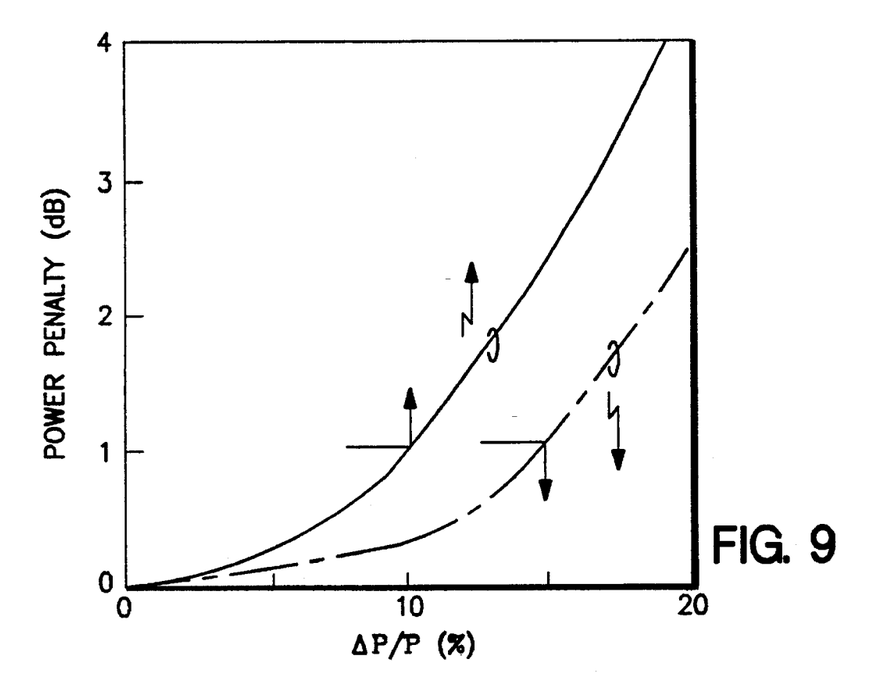
FIG. 9 is a diagram illustrative of a variation in power penalty of a light emitted from a facet of a laser section versus a coefficient of variation in threshold current of the laser section in a fourth embodiment according to the present invention as well as illustrative of a variation in power penalty of a light emitted from a facet of a laser section versus a coefficient of variation in power of the light in a fifth embodiment according to the present invention.

The predetermined reference value may be set according to a relationship of the difference between the first and second threshold currents to a power penalty in view of a transmission bit rate as well as a practical transmission distance. The predetermined reference value is set to allow the power penalty to be equal to or below 1 dB. FIG. 8 illustrates the threshold current Ith (mA) versus the reverse bias voltage applied onto the modulator section 3 as well as an increment of the threshold current difference due to a leak current between the laser section 2 and the modulator section it. There is needed a compensation for the increment of the threshold current difference due to the leak current between the laser section 2 and the modulator section 3. FIG. 9 illustrates the power penalty versus the coefficient of the variation in threshold current, from which it could be understood that when the power penalty is required to be below 1 dB, the coefficient of the variation in threshold current is required to be below 1%. It is verified whether the coefficient of the variation in threshold current calculated from the compensated difference in threshold current be below 1%.

Figure 10:
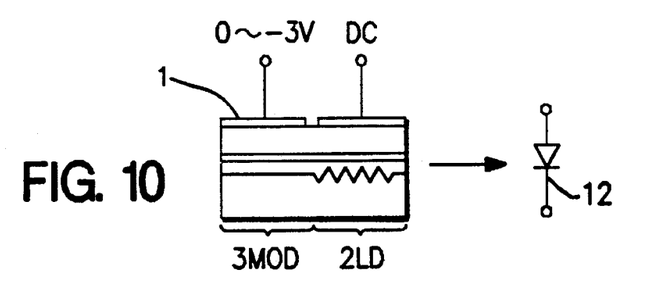
FIG. 10 is a view illustrative of a novel method for selecting a semiconductor integrated optical modulator/laser light source device comprising a modulator section and a laser section in a fifth embodiment according to the present invention.
Figure 11:
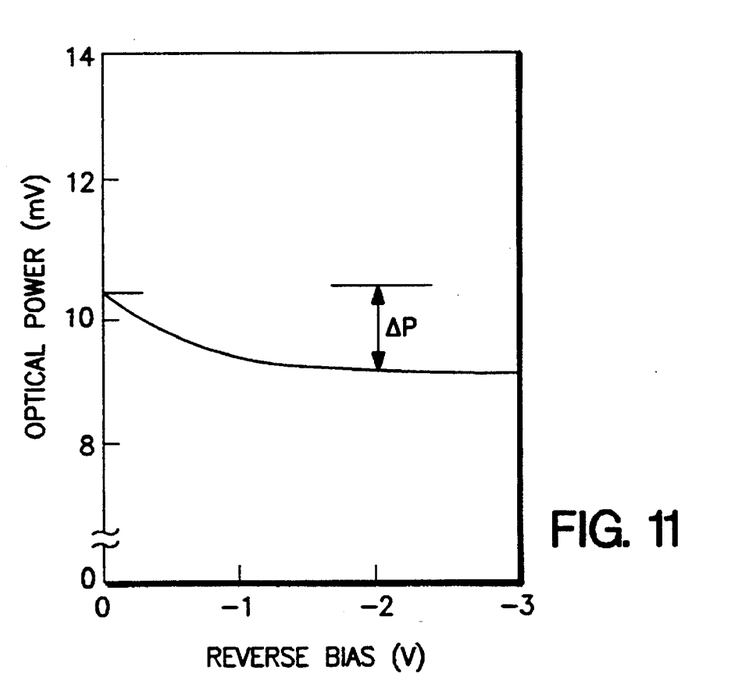
FIG. 11 is a diagram illustrative of a variation in power of a light emitted from a facet of a laser section versus a reverse bias voltage applied onto a modulator section in a fifth embodiment according to the present invention.

A fifth embodiment according to the present invention will be described with reference to FIGS. 10 and 11 in which a novel method for selecting a semiconductor integrated optical modulator/laser light source device comprising a laser section 2 and a modulator section 3 is provided. There are measured both a first threshold current of the laser section 2 when the modulator section 3 is reversely biased with 0 V and a second threshold current of the laser section when the modulator section is reversely biased with −3 V. The modulator section 3 performs no light attenuation function when applying 0 V onto the modulator section 3 and the modulator section 3 performs a light attenuation when applying −3 V onto the modulator section 3. There is verified the fact that a difference between the first and second optical powers be below a predetermined reference value by confirming a laser emission from the laser section 2 by use of a photo-diode 12.

The predetermined reference value may be set according to a relationship of the difference between the first and second optical powers to a power penalty in view of a transmission bit rate as well as a practical transmission distance. The predetermined reference value is set to allow the power penalty to be equal to or below 1 dB. FIG. 11 illustrates the optical power (mW) versus the reverse bias voltage applied onto the modulator section 3 as well as an increment of the optical power difference due to a leak current between the laser section 2 and the modulator section 3. Referring back to FIG. 9 which illustrates the power penalty versus the coefficient of the variation in optical power, it could be understood that when the power penalty is required to be below 1 dB, the coefficient of the variation in optical power is required to be below 15%. It is verified whether the coefficient of the variation in threshold current calculated from the compensated difference in optical power be below 15%.

Figure 12:
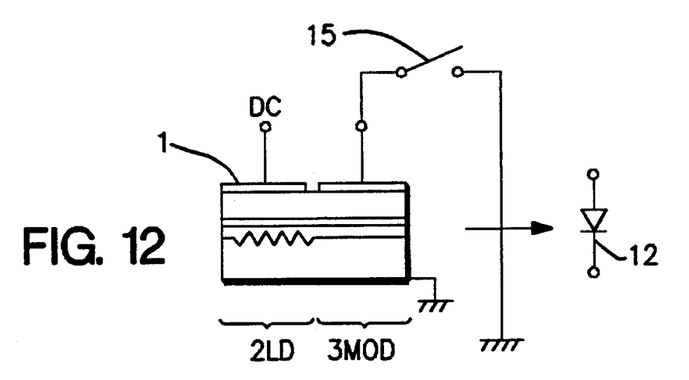
FIG. 12 is a view illustrative of a novel method for selecting a semiconductor integrated optical modulator/laser light source device comprising a modulator section and a laser section in a sixth embodiment according to the present invention.
Figure 13:
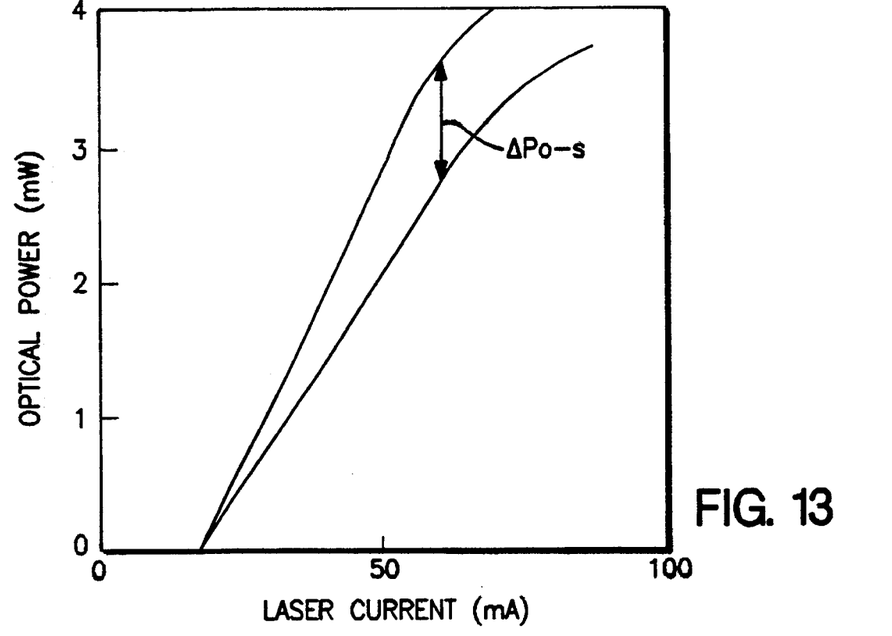
FIG. 13 is a diagram illustrative of a variation in power of a light emitted from a facet of a laser section versus a direct current applied to a laser section at both times when a terminal of a modulator section is electrically floated and grounded in a sixth embodiment according to the present invention.
Figure 14:
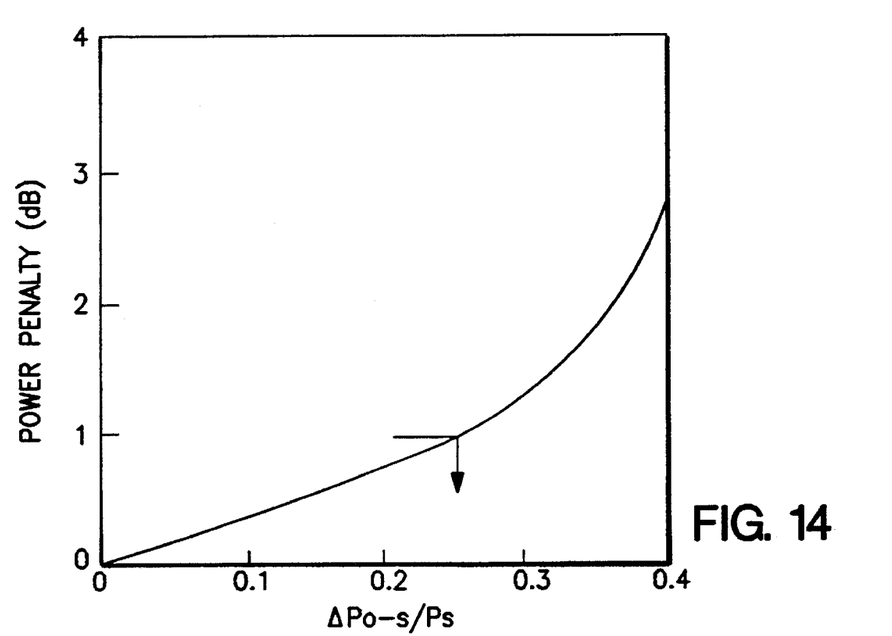
FIG. 14 is a diagram illustrative of a variation in power penalty of a light emitted from a facet of a laser section versus a coefficient of variation in power of the light between times when a terminal of a modulator section is electrically floated and grounded in a sixth embodiment according to the present invention.

A sixth embodiment according to the present invention will be described with reference to FIGS. 12, 13 and 14 in which a novel method for selecting a semiconductor integrated optical modulator/laser light source device comprising a laser section 2 and a modulator section 3 is provided. There are measured both a first power of a light emitted from a facet of the modulator section 3 when a terminal of the modulator section has a ground potential and a second power of the light emitted from the facet of the modulator section 3 when the terminal of the modulator section 3 is electrically floated so that the modulator section is forwardly biased with a built-in-potential generated at a p-n junction in the modulator. The difference between the first and second powers is found to find the coefficient of the variation in the optical powers. FIG. 14 illustrates the power penalty versus the coefficient of the variation in the power, from which it could be understood that when the power penalty is required to be below 1 dB, the coefficient of the variation in the power is required to be below 0.25. There is verified the fact that the coefficient of the variation of the power be below 0.25.

Figure 15:
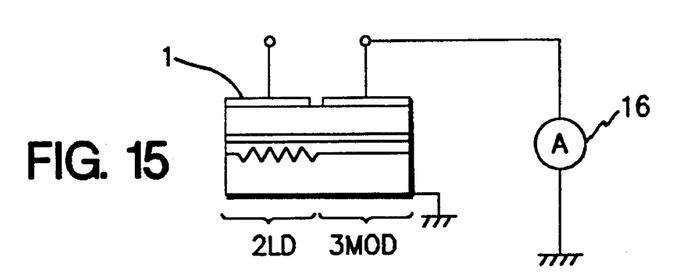
FIG. 15 is a view illustrative of a novel method for selecting a semiconductor integrated optical modulator/laser light source device comprising a modulator section and a laser section in a seventh embodiment according to the present invention.
Figure 16:
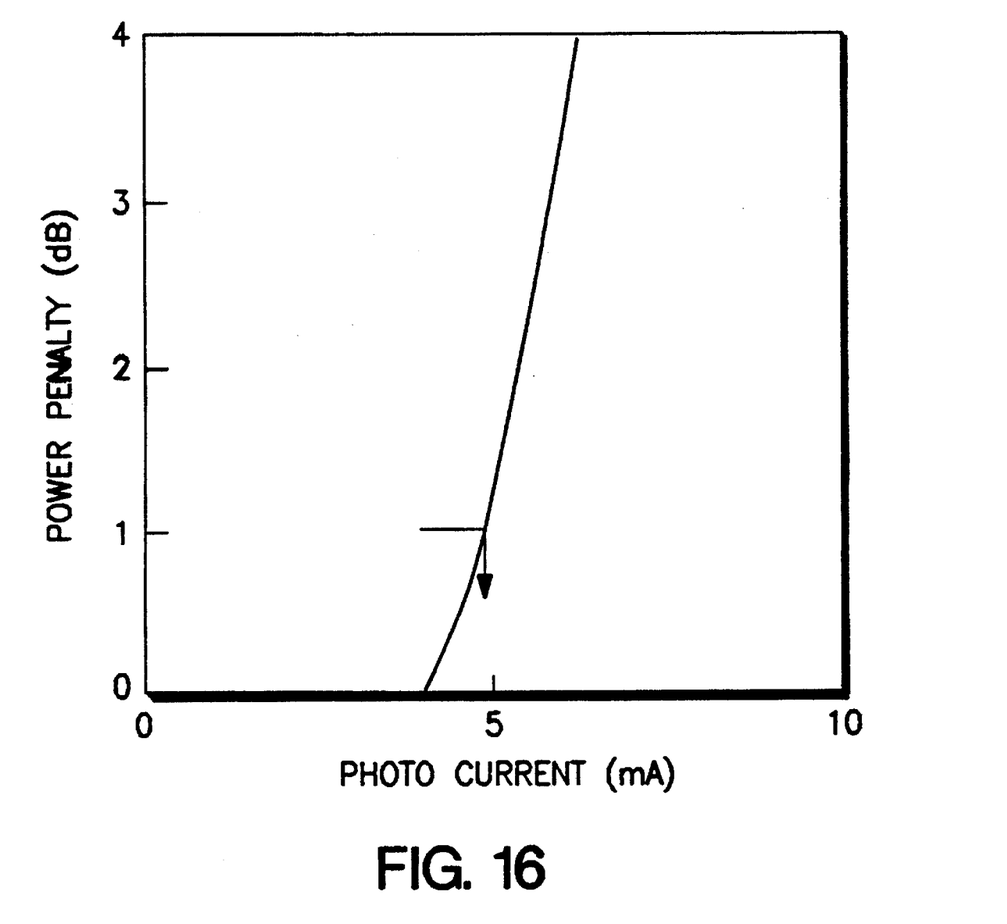
FIG. 16 is a diagram illustrative of a variation in power penalty of a light emitted from a facet of a laser section versus a photo current generated due to an optical absorption of a laser in a modulator section in a seventh embodiment according to the present invention.

A seventh embodiment according to the present invention will be described with reference to FIGS. 15 and 16 in which a novel method for selecting a semiconductor integrated optical modulator/laser light source device comprising a laser section 2 and a modulator section 3 is provided. The laser section 2 is supplied with a direct current which is equal to or larger than a threshold current for allowing the laser section to show a laser emission so as to allow a light emitted from the laser section to pass through the modulation section within which the light shows an absorption thereby electron-hole pairs which may act as carriers are generated wherein a terminal of the modulator section is grounded to cause a photo current due to the electron-hole pairs generated. The modulator section 3 is grounded via an ampere meter 16 for measuring a photo current to evaluate the accumulation state of the carrier generated by the optical absorption in the modulator section 3. FIG. 16 illustrates the power penalty versus the optical current, from which it could be understood that when the power penalty is required to be below 1 dB, the photo current is required to be below 5 mA. There is verified the fact that the photo current caused be below 5 mA.

Whereas modifications of the present invention will be apparent to a person having ordinary skill in the art, to which the invention pertains, it is to be understood that embodiments shown and described by way of illustrations are by no means intended to be considered in a limiting sense. Accordingly, it is to be intended to cover by claims all modifications which fall within the spirit and scope of the present invention.

What is claimed is:

1. A method for selecting a semiconductor integrated optical modulator/laser light source device comprising a modulator section and a laser section, said method comprising the steps of:

measuring both a first threshold current of said laser section when said modulator section is reversely biased with a first direct-current voltage and a second threshold current of said laser section when said modulator section is reversely biased with a second direct-current voltage, said first and second direct-current voltages respectively corresponding to first and second voltage levels of a binary pulse signal to be practically used for a pulse modulation of said modulator section wherein said modulator section performs no light attenuation function in said first direct-current voltage and said modulator section performs a light attenuation in said second direct-current voltage; and verifying that a difference between said first and second threshold currents be below a predetermined reference value.

2. The method as claimed in claim 1, wherein said first and second threshold currents are measured by verifying an emission of said light from said facet of said laser section by use of a photodetector.

3. The method as claimed in claim 1, further comprising the step of:

compensating, prior to said verifying step, for an increment of said difference between said first and second threshold currents, said increment being due to an emission light wavelength shift of said laser section, said shift being caused by a heat generation in said modulator section only when reversely biased with said second direct current voltage.

4. The method as claimed in claim 3, wherein said predetermined reference value is set according to a relationship of said difference between said first and second threshold currents to a power penalty in view of a transmission bit rate as well as a practical transmission distance.

5. The method as claimed in claim 4, wherein said predetermined reference value is set to allow said power penalty to be equal to or below 1 dB.

6. The method as claimed in claim 1, wherein said predetermined reference value is set according to a relationship of said difference in frequency between said first and second peaks to a power penalty in view of a transmission bit rate and a practical transmission distance as well as an increment of said difference between said first and second threshold currents, said increment being due to an emission light wavelength shift of said laser section, said shift being caused by a heat generation in said modulator section only when reversely biased with said second direct current voltage.

7. The method as claimed in claim 1, wherein said first and second direct-current voltages supplied to said modulator section are 0 V and −3 V respectively.

8. The method as claimed in claim 1, wherein said optical modulator section comprises an electroabsorption modulator.

9. The method as claimed in claim 1, wherein said optical modulator section comprises a semiconductor Mach-Zehnder optical modulator.

10. The method as claimed in claim 1, wherein said laser section comprises a distributed feedback laser.

* * * * *